US008726138B2

(12) United States Patent
Park et al.

(10) Patent No.: US 8,726,138 B2
(45) Date of Patent: May 13, 2014

(54) METHODS AND SYSTEMS FOR MODIFIED MAXIMUM-LIKELIHOOD BASED TBCC DECODING

(75) Inventors: Ju Won Park, San Ramon, CA (US); Brian Banister, San Diego, CA (US); Je Woo Kim, Cupertino, CA (US); Jong Hyeon Park, San Diego, CA (US); Matthias Brehler, Boulder, CO (US); Remi Gurski, San Diego, CA (US); Tae Chang, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1045 days.

(21) Appl. No.: 12/250,169

(22) Filed: Oct. 13, 2008

(65) Prior Publication Data

US 2010/0095189 A1    Apr. 15, 2010

(51) Int. Cl.
    *H03M 13/00*    (2006.01)
(52) U.S. Cl.
    USPC ............ 714/794; 714/755; 714/795; 375/262
(58) Field of Classification Search
    USPC .................... 714/755, 795; 375/262
    See application file for complete search history.

(56) References Cited

U.S. PATENT DOCUMENTS

| 5,600,677 | A * | 2/1997 | Citta et al. | 375/296 |
| 6,256,764 | B1 * | 7/2001 | Atallah | 714/795 |
| 7,640,478 | B2 * | 12/2009 | Hedayat et al. | 714/755 |
| 7,792,205 | B2 * | 9/2010 | Zhang et al. | 375/262 |
| 7,856,591 | B2 * | 12/2010 | Shi et al. | 714/795 |
| 2005/0060633 | A1 * | 3/2005 | Parhi et al. | 714/795 |
| 2007/0245209 | A1 * | 10/2007 | Shi et al. | 714/755 |

FOREIGN PATENT DOCUMENTS

EP    0920138    6/1999

OTHER PUBLICATIONS

Black, "A 1-Gb/s, Four-State, sliding block Botervi decoder", Jun. 6, 1997, IEEE, vol. 32 No. 6, p. 797-805.*
Anderson, John B. et al.: "Tailbiting MAP Decoders," IEEE Journal on Selected Areas in Communications, IEEE Service Center, Piscataway, NJ, US, vol. 16, No. 2, (Feb. 1, 1998), XP011054746, ISSN: 0733-8716 the whole document.
Cox, Richard V. et al.:: "An Efficient Adaptive Circular Viterbi Algorithm for Decoding Generalized Tailbiting Convolutional Codes," IEEE Transactions on Vehicular Technology, IEEE Service Center, Piscataway, NJ, USA, vol. 43, No. 1, (Feb. 1, 1994), pp. 57-68, XP000450947; ISSN: 0018-9545, the whole document.
International Search Report and Written Opinion—PCT/US2009/059146, International Search Authority—European Patent Office—Dec. 10, 2009.

(Continued)

*Primary Examiner* — Joshua P Lottich
*Assistant Examiner* — Jeison C Arcos
(74) *Attorney, Agent, or Firm* — Tyler J. Overall

(57) ABSTRACT

A method and apparatus for decoding of tailbiting convolutional codes (TBCC) are disclosed. The proposed modified maximum-likelihood TBCC decoding technique preserves error correction performance of optimal maximum-likelihood based TBCC decoding, while the computational complexity is substantially decreased since a reduced number of decoding states has been evaluated. Compare to other suboptimal TBCC decoding algorithms, modified maximum-likelihood TBCC decoding achieves improved packet error rate performance with similar computational complexity.

12 Claims, 11 Drawing Sheets

(56) References Cited

OTHER PUBLICATIONS

Krishnan, K. et al.: "Approximate Linear Time ML Decoding on Tail-Biting Trellises in Two Rounds," 2006 IEEE International Symposium on Information Theory, (Jul. 1, 2006), pp. 2245-2249, XP031032616, ISBN: 978-1-4244-0505-3, p. 2245, left-hand column, paragraph 1 through p. 2247, left-hand column, paragraph 1.

Madhu, A.S. et al.: "Approximate MAP Decoding on Tail-Biting Trellises," Proceedings, IEEE International Symposium on Information Theory, ISIT 2005, Adelaide, Australia, (Sep. 4, 2005), pp. 1325-1328, XP010845763, ISBN: 978-0-7803, doi:10.1109/ISIT.2005.1523557.

Shao, Rose; Lin, Shu; and Fossorier, Marc P.C.: "Two Decoding Algorithms for Tailbiting Codes," IEEE Transactions on Communications, IEEE Service Center, Piscataway, NJ, US, vol. 51, No. 10, (Oct. 1, 2003), pp. 1658-1665, XP011102444, ISSN: 0090-6778 the whole document.

\* cited by examiner

| Channel/Algorithm | ML | REP3 | REP5 | REP11 | REP47 | MoML12 | MoML24 | MoML36 |
|---|---|---|---|---|---|---|---|---|
| AWGN | 3.68 | 3.95 | 3.80 | 3.77 | 3.75 | 3.72 | 3.68 | 3.68 |
| Rayleigh | 6.75 | 7.15 | 6.90 | 6.88 | 6.88 | 6.80 | 6.75 | 6.75 |

$E_b/N_0$ [dB] @ PER = $10^{-3}$

FIG. 8

METHODS AND SYSTEMS FOR MODIFIED MAXIMUM-LIKELIHOOD BASED TBCC DECODING

TECHNICAL FIELD

Certain embodiments of the present disclosure generally relate to a method and system for decoding data encoded with error correcting codes.

BACKGROUND

Information data communicated between a transmitter and receiver in a wireless system can be corrupted by various channel effects such as noise, fading, and multi-path effects. Thus, a technique applied at a transmitter known as error correction coding is typically employed to mitigate different effects of wireless communication channels. By introducing a redundancy in the transmission data, channel coding can reduce a probability that various channel effects will corrupt useful information. In most cases, the channel coding has been proven to be successful in different channel environments, and it is commonly adopted as a required part of the transmitter and receiver for different emerging communication standards.

Convolutional codes are error correction codes well-known in the art for mitigating different channel effects, such as noise and block fading. One kind of convolutional codes, which has been adopted as a standard for North American digital cellular radio communications, is known as IS-130 by the International Telecommunication Union. IS-130 employs a type of convolutional code known in the art as a tailbiting convolutional code (TBCC), in which encoding and decoding of information data are performed in a blockwise manner. The term tailbiting refers to the fact that encoder's starting and ending states are identical.

Although the decoder knows that the encoder begins and ends in the same encoding state, the decoder does not know the value of that state. Therefore, the initial encoding state is unknown to the decoder. Furthermore, an encoder may have started in any of possible encoding states with approximately equal probability. Hence, the main challenge for designing efficient TBCC decoder is that a decoder must be able to quickly and accurately determine the initial encoding state.

There are two types of tailbiting convolutional codes: the non-recursive and recursive codes. For a non-recursive (feed forward) TBCC, the encoder's shift registers may be initialized by the last $K-1$ information bits in reversed order, where $K-1$ is the number of encoder's memory elements, and K is the constraint length. Once the initialization is finished, the encoding process may start similarly to the conventional convolutional coding. For a recursive (feedback) TBCC, the encoding is performed twice. The first encoding process may be performed to find ending state of the input sequence. The starting state is all-zero state and the encoding process may be the same as that of conventional convolutional encoder. In the second stage, the encoder may be initialized with ending state obtained from the first encoding stage. Then, encoding may be applied to produce a TBCC encoded bit-sequence by using the same information bit-sequence as in the first encoding stage.

Encoding complexity of a non-recursive TBCC is the same as that of convolutional coding. However, encoding complexity of the recursive TBCC is doubled compared to the convolutional coding of the same constraint length. Since the non-recursive and recursive convolutional codes have similar error rate performance, the non-recursive codes are usually preferred. Each forward error correction (FEC) block may be encoded by utilizing a non-recursive TBCC encoder. This is achieved by initializing an encoder's memory with the last data bits of the FEC block that is being encoded.

The TBCC decoding based on a maximum-likelihood (ML) search of decoding states is an optimal decoding algorithm for tailbiting convolutional codes in terms of error correcting performance. This technique is based on the Viterbi Algorithm (VA) which enumerates all codewords and selects the most likely one. The decoder evaluates all possible starting states while knowing that the ending state is the same. For each starting state, the VA decoding is applied while the ending state is forced to be the same as the starting state. Therefore, the VA is utilized $2^{K-1}$ times, where $K-1$ is the number of memory elements in the TBCC decoder with constraint length of K. The decoder chooses the surviving path with the highest path metric (most likely path) out of $2^{K-1}$ paths.

Although the outcome is correct in most cases, the ML based TBCC decoding algorithm may be unacceptably complex and slow for many applications. The decoding time is always $2^{K-1}$ longer than that of the encoder's non-tailbiting counterpart. As a result, the ML based TBCC decoder may place great demands on computational resources.

Therefore, it is desirable to have an algorithm that achieves error correction performance close to that of ML based TBCC decoders, but with reduced computational complexity.

SUMMARY

Certain embodiments of the present disclosure provide a method for performing a tail biting convolution code (TBCC) decoding scheme. The method generally includes receiving a block of encoded data bits encoded with a redundancy such that a final decoding state of the block is identical to a starting decoding state of the block, selecting M most likely final states from a set of more than M possible final decoding states, each selected final decoding state having an associated identical starting decoding state, selecting a most likely path based on results of applying a maximum likelihood (ML) algorithm to evaluate paths between pairs of the selected final decoding states and associated starting decoding states, and obtaining decoded data bits by tracing back from the selected most likely path.

Certain embodiments of the present disclosure provide an apparatus for performing a tail biting convolution code (TBCC) decoding scheme. The apparatus generally includes logic for receiving a block of encoded data bits encoded with a redundancy such that a final decoding state of the block is identical to a starting decoding state of the block, logic for selecting M most likely final states from a set of more than M possible final decoding states, each selected final decoding state having an associated identical starting decoding state, logic for selecting a most likely path based on results of applying a maximum likelihood (ML) algorithm to evaluate paths between pairs of the selected final decoding states and associated starting decoding states, and logic for obtaining decoded data bits by tracing back from the selected most likely path.

Certain embodiments of the present disclosure provide an apparatus for performing a tail biting convolution code (TBCC) decoding scheme. The apparatus generally includes means for receiving a block of encoded data bits encoded with a redundancy such that a final decoding state of the block is identical to a starting decoding state of the block, means for selecting M most likely final states from a set of more than M possible final decoding state having an associated identical starting decoding state, means for selecting a most likely path based on results of applying a maximum likelihood (ML) algorithm to evaluate paths between pairs of the selected final decoding states and associated starting decoding states, and means for obtaining decoded data bits by tracing back from the selected most likely path.

Certain embodiments of the present disclosure provide a computer-program product for performing a tail biting convolution code (TBCC) decoding scheme comprising a computer readable medium having instructions stored thereon, the instructions being executable by one or more processors. The instructions generally include instructions for receiving a block of encoded data bits encoded with a redundancy such that a final decoding state of the block is identical to a starting decoding state of the block, instructions for selecting M most likely final states from a set of more than M possible final decoding states, each selected final decoding state having an associated identical starting decoding state, instructions for selecting a most likely path based on results of applying a maximum likelihood (ML) algorithm to evaluate paths between pairs of the selected final decoding states and associated starting decoding states, and instructions for obtaining decoded data bits by tracing back from the selected most likely path.

BRIEF DESCRIPTION OF THE DRAWINGS

So that the manner in which the above recited features of the present disclosure can be understood in detail, a more particular description, briefly summarized above, may be had by reference to embodiments, some of which are illustrated in the appended drawings. It is to be noted, however, that the appended drawings illustrate only certain typical embodiments of this disclosure and are therefore not to be considered limiting of its scope, for the description may admit to other equally effective embodiments.

FIG. 8 is a table that summarizes packet error rate performance results of different TBCC decoding algorithms in AWGN and Rayleigh fading channels.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The techniques described herein may be used for various broadband wireless communication systems, including communication systems that are based on an orthogonal multiplexing scheme. Examples of such communication systems include Orthogonal Frequency Division Multiple Access (OFDMA) systems, Single-Carrier Frequency Division Multiple Access (SC-FDMA) systems, and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

One specific example of a communication system based on an orthogonal multiplexing scheme is a WiMAX system. WiMAX, which stands for the Worldwide Interoperability for Microwave Access, is a standards-based broadband wireless technology that provides high-throughput broadband connections over long distances. There are two main applications of WiMAX today: fixed WiMAX and mobile WiMAX. Fixed WiMAX applications are point-to-multipoint, enabling broadband access to homes and businesses, for example. Mobile WiMAX offers the full mobility of cellular networks at broadband speeds.

IEEE 802.16x is an emerging standard organization to define an air interface for fixed and mobile broadband wireless access (BWA) systems. These standards define at least four different physical layers (PHYs) and one media access control (MAC) layer. The OFDM and OFDMA physical layer of the four physical layers are the most popular in the fixed and mobile BWA areas respectively.

Figure 1:
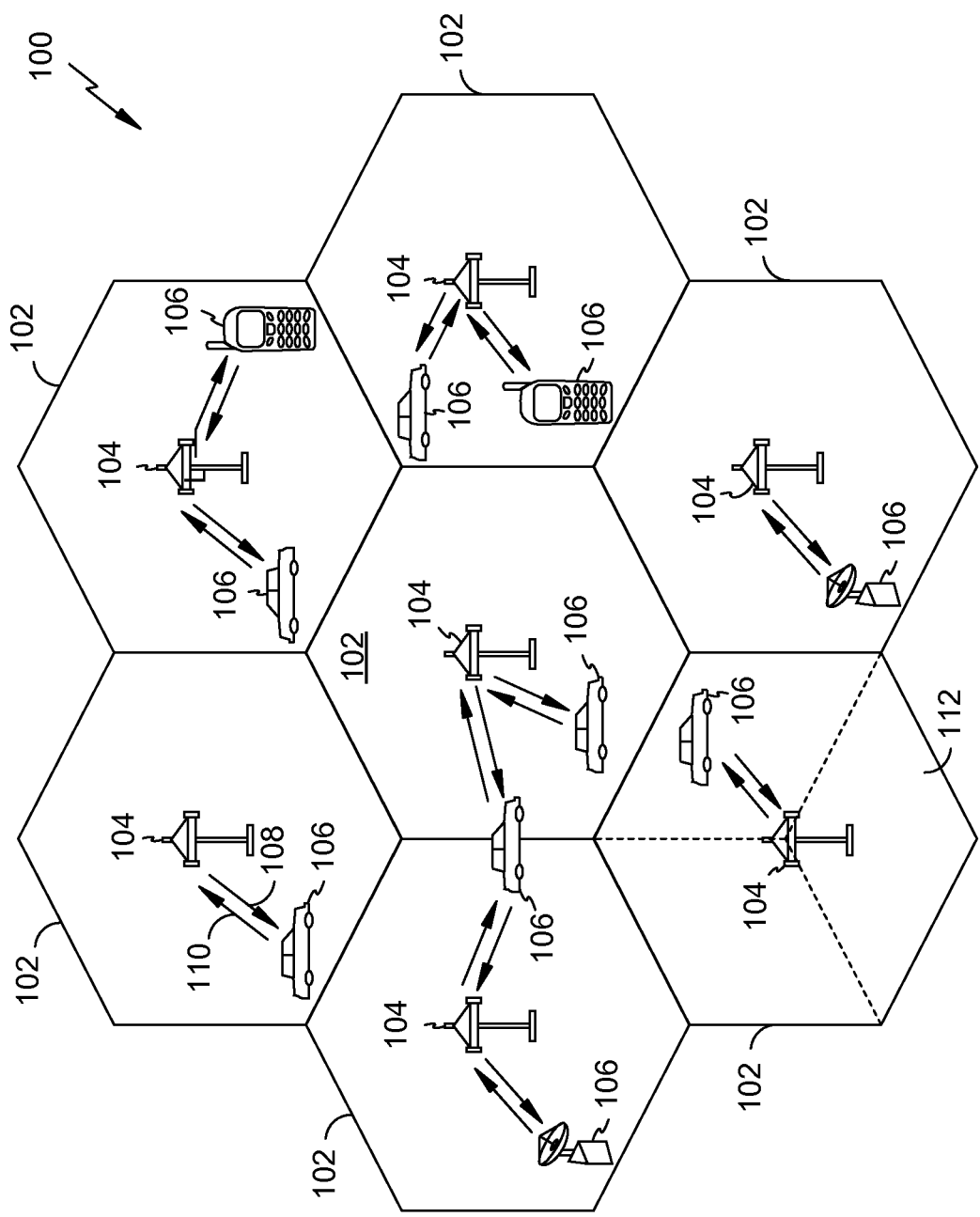
FIG. 1 illustrates an example wireless communication system, in accordance with certain embodiments of the present disclosure.

FIG. 1 illustrates an example of a wireless communication system 100 in which embodiments of the present disclosure may be employed. The wireless communication system 100 may be a broadband wireless communication system. The wireless communication system 100 may provide communication for a number of cells 102, each of which is serviced by a base station 104. A base station 104 may be a fixed station that communicates with user terminals 106. The base station 104 may alternatively be referred to as an access point, a Node B or some other terminology.

FIG. 1 depicts various user terminals 106 dispersed throughout the system 100. The user terminals 106 may be fixed (i.e., stationary) or mobile. The user terminals 106 may alternatively be referred to as remote stations, access terminals, terminals, subscriber units, mobile stations, stations, user equipment, etc. The user terminals 106 may be wireless devices, such as cellular phones, personal digital assistants (PDAs), handheld devices, wireless modems, laptop computers, personal computers, etc.

A variety of algorithms and methods may be used for transmissions in the wireless communication system 100 between the base stations 104 and the user terminals 106. For example, signals may be sent and received between the base stations 104 and the user terminals 106 in accordance with OFDM/OFDMA techniques. If this is the case, the wireless communication system 100 may be referred to as an OFDM/OFDMA system.

A communication link that facilitates transmission from a base station 104 to a user terminal 106 may be referred to as a downlink (DL) 108, and a communication link that facilitates transmission from a user terminal 106 to a base station 104 may be referred to as an uplink (UL) 110. Alternatively, a downlink 108 may be referred to as a forward link or a forward channel, and an uplink 110 may be referred to as a reverse link or a reverse channel.

A cell 102 may be divided into multiple sectors 112. A sector 112 is a physical coverage area within a cell 102. Base stations 104 within a wireless communication system 100 may utilize antennas that concentrate the flow of power within a particular sector 112 of the cell 102. Such antennas may be referred to as directional antennas.

Figure 2:
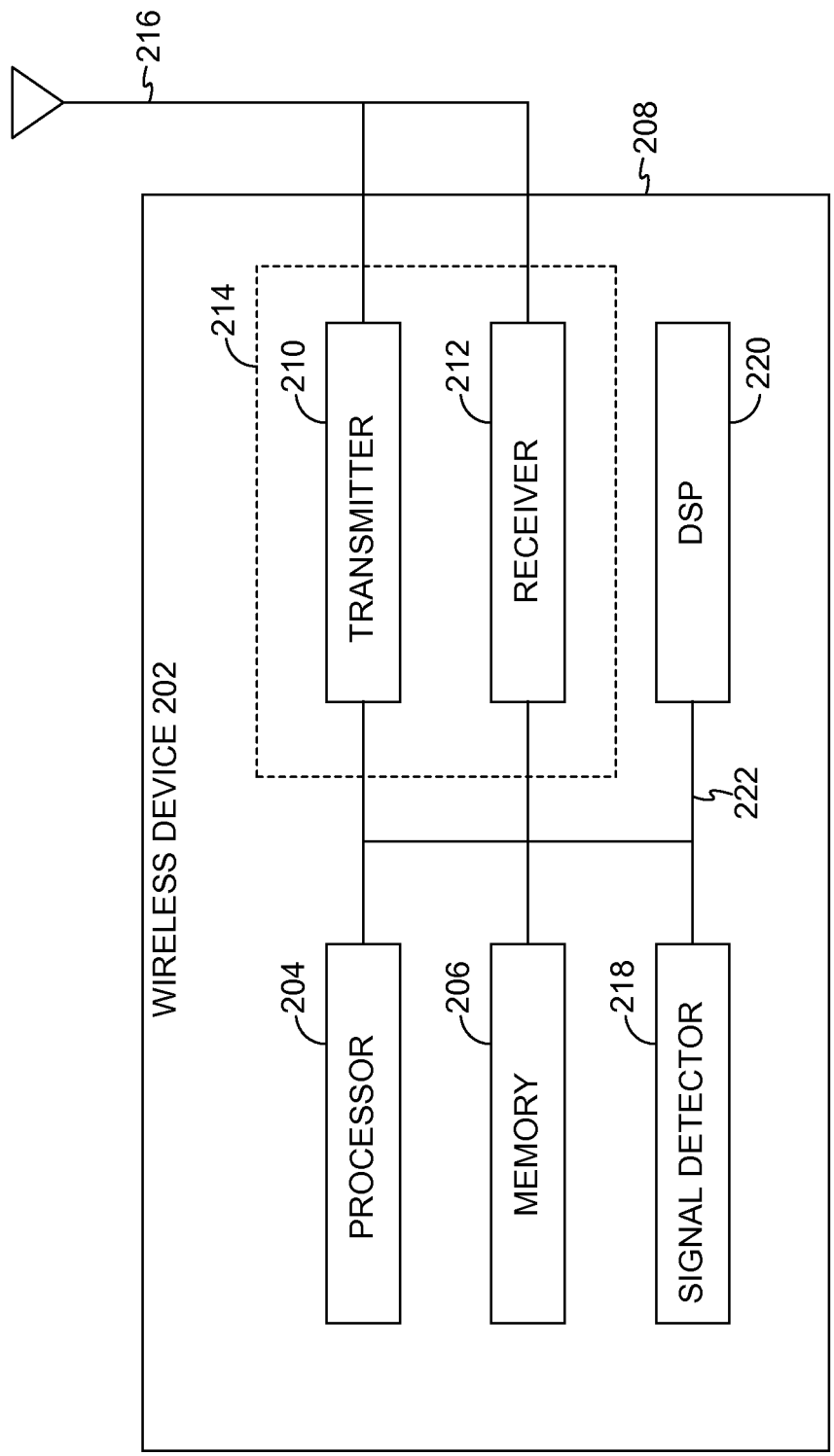
FIG. 2 illustrates various components that may be utilized in a wireless device in accordance with certain embodiments of the present disclosure.

FIG. 2 illustrates various components that may be utilized in a wireless device 202 that may be employed within the wireless communication system 100. The wireless device 202 is an example of a device that may be configured to implement the various methods described herein. The wireless device 202 may be a base station 104 or a user terminal 106.

The wireless device 202 may include a processor 204 which controls operation of the wireless device 202. The processor 204 may also be referred to as a central processing unit (CPU). Memory 206, which may include both read-only memory (ROM) and random access memory (RAM), provides instructions and data to the processor 204. A portion of the memory 206 may also include non-volatile random access memory (NVRAM). The processor 204 typically performs logical and arithmetic operations based on program instructions stored within the memory 206. The instructions in the memory 206 may be executable to implement the methods described herein.

The wireless device 202 may also include a housing 208 that may include a transmitter 210 and a receiver 212 to allow transmission and reception of data between the wireless device 202 and a remote location. The transmitter 210 and receiver 212 may be combined into a transceiver 214. An antenna 216 may be attached to the housing 208 and electrically coupled to the transceiver 214. The wireless device 202 may also include (not shown) multiple transmitters, multiple receivers, multiple transceivers, and/or multiple antennas.

The wireless device 202 may also include a signal detector 218 that may be used in an effort to detect and quantify the level of signals received by the transceiver 214. The signal detector 218 may detect such signals as total energy, energy per subcarrier per symbol, power spectral density and other signals. The wireless device 202 may also include a digital signal processor (DSP) 220 for use in processing signals.

The various components of the wireless device 202 may be coupled together by a bus system 222, which may include a power bus, a control signal bus, and a status signal bus in addition to a data bus.

Figure 3:
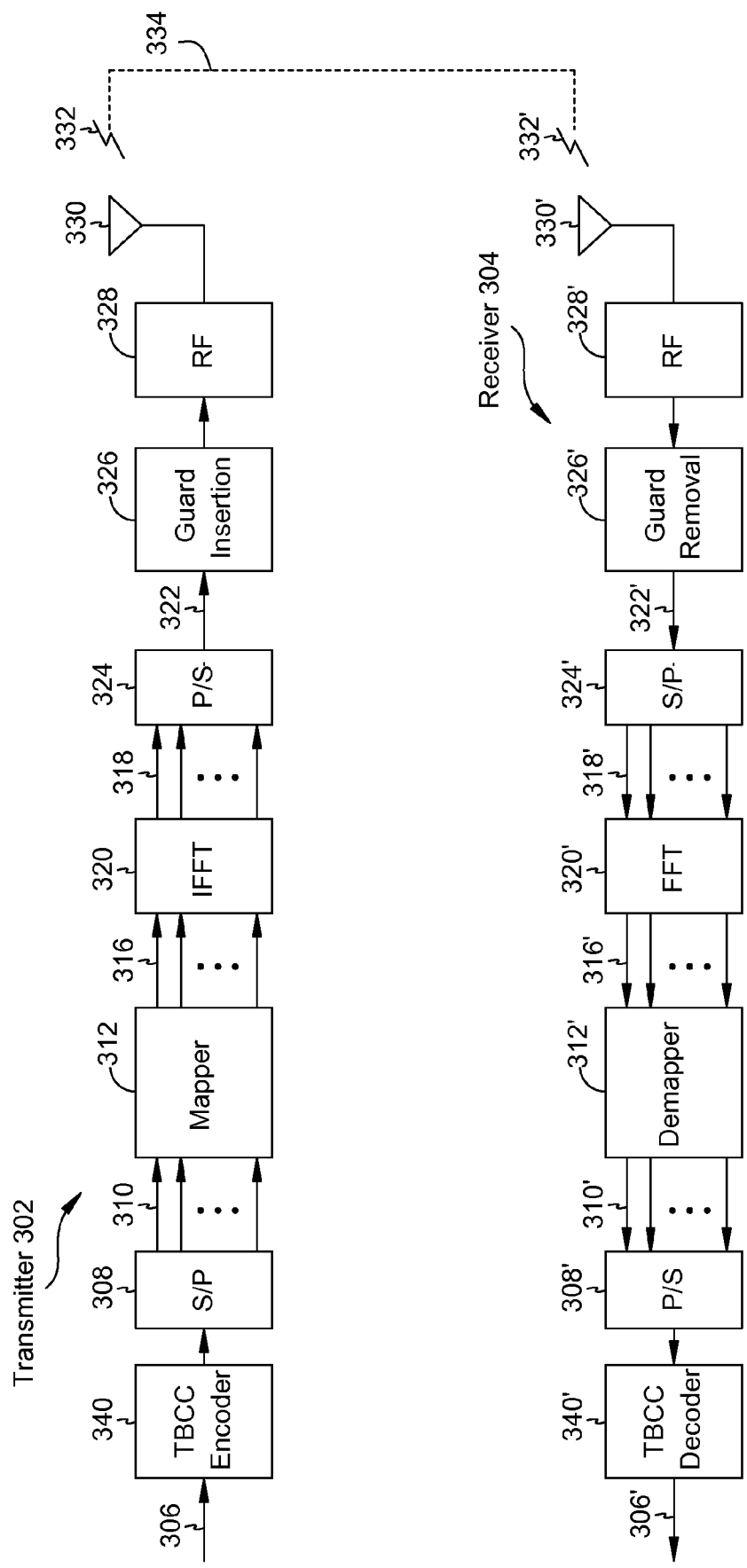
FIG. 3 illustrates an example transmitter and an example receiver that may be used within a wireless communication system in accordance with certain embodiments of the present disclosure.

FIG. 3 illustrates an example of a transmitter 302 that may be used within a wireless communication system 100 that utilizes OFDM/OFDMA. Portions of the transmitter 302 may be implemented in the transmitter 210 of a wireless device 202. The transmitter 302 may be implemented in a base station 104 for transmitting data 304 to a user terminal 106 on a downlink 108. The transmitter 302 may also be implemented in a user terminal 106 for transmitting data 306 to a base station 104 on an uplink 110.

Information data 306 to be transmitted is shown being provided as input to the TBCC encoder 340. The redundancy is included in the information signal to provide better error protection during the transmission over noisy wireless channels. Coded data are then input to serial-to-parallel (S/P) converter 308. The S/P converter 308 may split the transmission data into M parallel data streams 310.

The M parallel data streams 310 may then be provided as input to a mapper 312. The mapper 312 may map the M parallel data streams 310 onto M constellation points. The mapping may be done using some modulation constellation, such as binary phase-shift keying (BPSK), quadrature phase-shift keying (QPSK), 8 phase-shift keying (8PSK), quadrature amplitude modulation (QAM), etc. Thus, the mapper 312 may output M parallel symbol streams 316, each symbol stream 316 corresponding to one of the M orthogonal subcarriers of the inverse fast Fourier transform (IFFT) 320. These M parallel symbol streams 316 are represented in the frequency domain and may be converted into M parallel time domain sample streams 318 by an IFFT component 320.

A brief note about terminology will now be provided. M parallel modulations in the frequency domain are equal to M modulation symbols in the frequency domain, which are equal to M mapping and M-point IFFT in the frequency domain, which is equal to one (useful) OFDM symbol in the time domain, which is equal to M samples in the time domain. One OFDM symbol in the time domain, $N_s$, is equal to $N_{cp}$ (the number of guard samples per OFDM symbol)+M (the number of useful samples per OFDM symbol).

The M parallel time domain sample streams 318 may be converted into an OFDM/OFDMA symbol stream 322 by a parallel-to-serial (P/S) converter 324. A guard insertion component 326 may insert a guard interval between successive OFDM/OFDMA symbols in the OFDM/OFDMA symbol stream 322. The output of the guard insertion component 326 may then be upconverted to a desired transmit frequency band by a radio frequency (RF) front end 328. An antenna 330 may then transmit the resulting signal 332.

FIG. 3 also illustrates an example of a receiver 304 that may be used within a wireless device 202 that utilizes OFDM/OFDMA. Portions of the receiver 304 may be implemented in the receiver 212 of a wireless device 202. The receiver 304 may be implemented in a user terminal 106 for receiving data 304 from a base station 104 on a downlink 108. The receiver 304 may also be implemented in a base station 104 for receiving data 306 from a user terminal 106 on an uplink 110.

The transmitted signal 332 is shown traveling over a wireless channel 334. When a signal 332' is received by an antenna 330', the received signal 332' may be downconverted to a baseband signal by an RF front end 328'. A guard removal component 326' may then remove the guard interval that was inserted between OFDM/OFDMA symbols by the guard insertion component 326.

The output of the guard removal component 326' may be provided to an S/P converter 324'. The S/P converter 324' may divide the OFDM/OFDMA symbol stream 322' into the M parallel time-domain symbol streams 318', each of which corresponds to one of the M orthogonal subcarriers. A fast Fourier transform (FFT) component 320' may convert the M parallel time-domain symbol streams 318' into the frequency domain and output M parallel frequency-domain symbol streams 316'.

A demapper 312' may perform the inverse of the symbol mapping operation that was performed by the mapper 312 thereby outputting M parallel data streams 310'. A P/S converter 308' may combine the M parallel data streams 310' into a single data stream. The decoded information data 306' are available after applying the TBCC decoder 340' and removing the redundancy from the information data included at the transmitter 302. Ideally, the decoded data stream 306' corresponds to the data 306 that was provided as input to the transmitter 302. Note that the elements 308', 310', 312', 316', 320', 318' and 324' may all be found in a baseband processor 350'.

Exemplary TBCC Decoding Scheme

The tailbiting convolutional code (TBCC) decoding based on the maximum-likelihood (ML) search of decoding states can achieve excellent error correcting performance, but the computational complexity is prohibitively high, especially for larger constraint lengths. In order to reduce the decoding complexity, one possibility is to utilize a sub-optimal decoding algorithm based on iterative VA (IVA). In the IVA approach, the conventional VA decoding is performed multiple times (iterations). At the beginning of the first iteration, the decoder starts from a randomly chosen state and performs the conventional VA algorithm. At the end of the first iteration, a survivor ending state can be declared, which belongs to the most likely path. The survivor ending state can be used to initialize the VA decoder for the next decoding iteration. This process may be repeated over a number of times (iterations) until the pre-determined maximum number of iterations is reached or the cyclic redundancy check (CRC) is passed.

It has been shown (e.g., in "*IEEE P802.16Rev2/D0b, IEEE DRAFT Standard for Local and Metropolitan Area Networks—Part 16 Air Interface for Broadband Wireless Access Systems*, June, 2007") that conventional iterative VA decoding schemes offers inferior error rate performance when compared to ML based TBCC decoding schemes, even with a large number of iterations. The error rate performance loss relative to the ML based TBCC decoding may be due to a propagation of error from one iteration to another if the wrong decoding state is selected.

Another sub-optimal TBCC decoding approach is an iterative maximum a posteriori (I-MAP) decoding, which employs forward and backward recursions. For the forward recursion, all initial states are set to be equally likely at the beginning of the first iteration. The decoding recursion can be repeated such that the initial state metrics for the current iteration are the same as the ending state metrics computed in the previous decoding iteration. The backward recursion is followed in the same fashion. The metrics attained at the last iteration step of forward and backward recursions can be utilized in the conventional MAP decoder to calculate the a posteriori probabilities of coded bits. The I-MAP TBCC decoding typically requires two decoding iterations to achieve error rate performance close to that of the ML based TBCC decoding algorithm. But, computational complexity of this approach may still be prohibitively high.

In order to further decrease the computational complexity, a replicated TBCC decoding may be applied. An example of this approach is illustrated in FIG. 4A where two received blocks of coded data are replicated and placed at the end of the received packet.

Figure 4A:
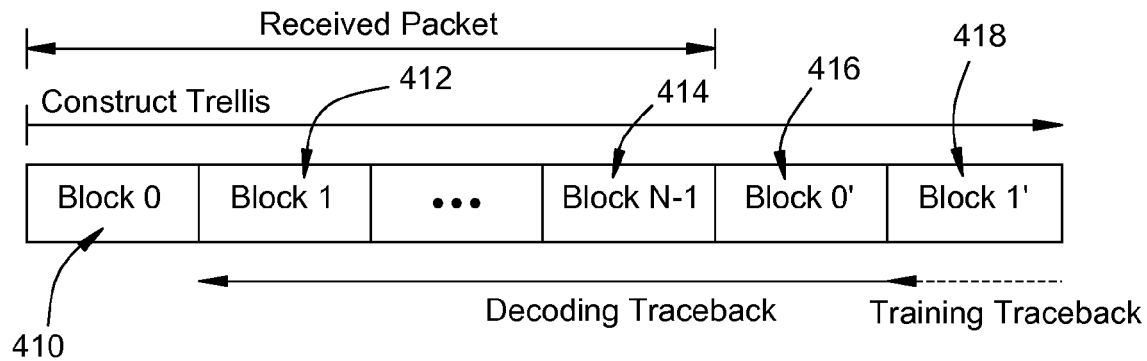
FIG. 4A illustrates a replicated TBCC decoding algorithm with direct traceback.

In the illustrated example, blocks 416 and 418 in FIG. 4A represent copies of blocks 410 and 412, respectively. All start state metrics can be initialized with same values because all starting states are assumed to be equally probable. The trellis can be constructed from the beginning of the original block 410 until the end of the replicated block 418. The original block 410 can be used to obtain the correct starting state for the purpose of trellis construction for block 412. Once the trellis is constructed, the traceback decoding may be performed from the replicated block 418, and from an arbitrary state. Block 418 can be used as the training traceback block of replicated block 416. The decoding traceback may start from the replicated block 416 as illustrated in FIG. 4A and may end at the beginning of the original block 412. In this way all N−1 blocks in the received packet are successfully decoded.

Figure 4B:
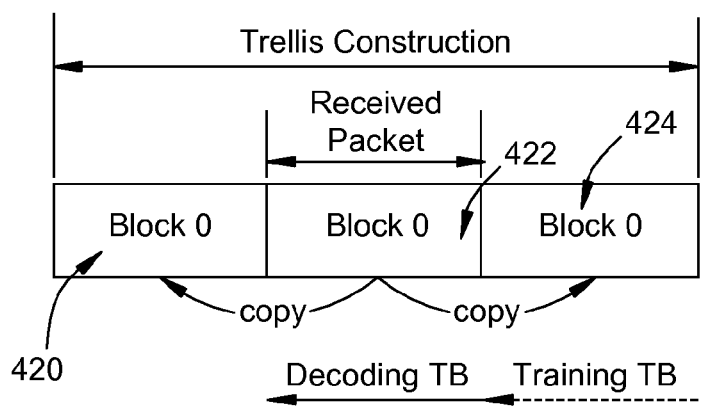
FIG. 4B illustrates a replicated TBCC decoding algorithm for short coding blocks.

For short encoding where the size of received packet is smaller than the decoding depth, the replicated decoding scheme may be modified, as illustrated in FIG. 4B. The received block 422 can be replicated twice and two copies (blocks 420 and 424) are placed before and after the original block. These three identical blocks may be used for the construction of trellis. Once the trellis is constructed, the replicated block 424 may be used as the training traceback for decoding of the original block 422. The arbitrary or the most likely ending state may be chosen for performing the traceback decoding.

Figure 5A:
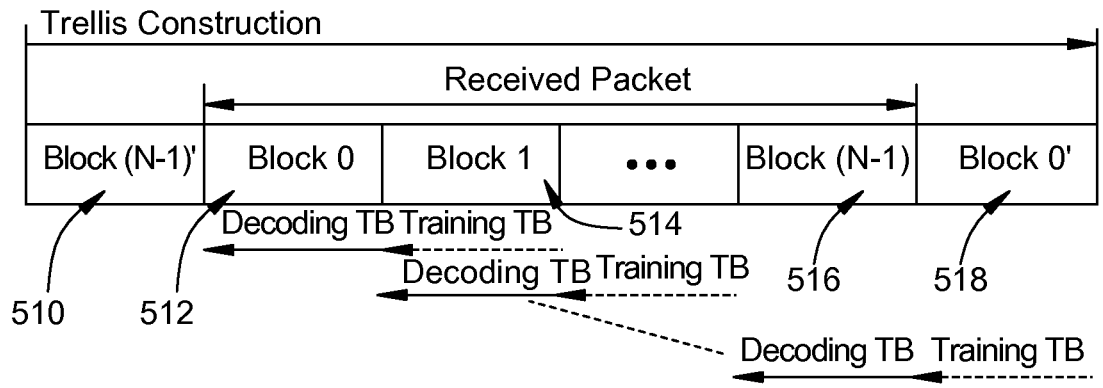
FIG. 5A illustrates a replicated TBCC decoding algorithm with a sliding window.

If the sliding window is utilized for training and decoding, memory requirements of replicated TBCC decoding may be reduced and decoding latency may be decreased. One example of replicated TBCC decoding with a sliding window is shown in FIG. 5A. The main feature of this approach is that the traceback decoding is performed in a block-by-block basis.

The last block in the received packet can be replicated (block 510) and placed before the first original block 512. The construction of trellis may start from the replicated block 510. To obtain a starting state for the decoding traceback for each block in the received packet, training traceback may be performed over the block adjacent to the block currently being decoded. The starting state for the training block can be randomly selected. For the last original block in the received packet (block 516), the ending state can be obtained by utilizing the training block 518 which represents the copy of the first block in the received packet (copy of the block 512).

Figure 5B:
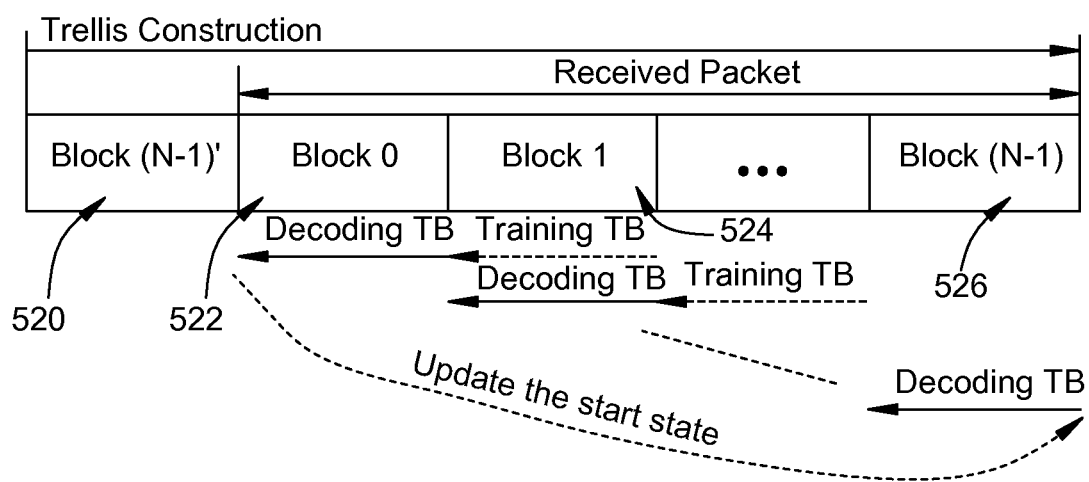
FIG. 5B illustrates an alternative version of replicated TBCC decoding algorithm with a sliding window.

Another example of the replicated TBCC decoding algorithm with sliding window is shown in FIG. 5B. The ending state for the last block in the received packet (block 526) may be initialized by the ending state of the first block 520. A copy of the last block 526 in the received packet (block 520) can be placed before the first original block 522, and the trellis construction may start from the replicated block 520.

There may be no significant error rate performance difference between these two variations of replicated TBCC decoding (shown in FIGS. 5A and 5B) with sliding window for training and decoding.

For larger sized coding blocks, the error rate performance of previously presented sub-optimal TBCC decoding algorithms (iterative and replicated TBCC decoding with or without a sliding window) are very close to error rate performance of ML based TBCC decoding. However, the error rate performance of ML based TBCC decoding may be superior to others (e.g., improved up to 0.4 dB) for smaller sized coding blocks.

However, as previously discussed, the main disadvantage of the ML based TBCC decoding is its computational complexity. For example, computational complexity of an ML based TBCC decoding is more than 20 times larger than the complexity of replicated TBCC decoding for the constraint length of K=7. This ratio is even larger if the constraint length is larger.

Exemplary Modified ML-Based TBDD Decoding Scheme

Certain embodiments of the present disclosure provide a modified ML based TBCC decoding scheme (hereinafter abbreviated as M-ML TBCC decoding) that may achieve improved error rate performance relative to sub-optimal TBCC decoding techniques, while similar computational complexity. In this algorithm the M most likely decoding states (or candidate states) may be evaluated out of $2^{K-1}$ decoding states. The M-ML TBCC decoding may achieve almost identical error rate performance as the ML based TBCC decoding, while the computational complexity is significantly reduced because only portion of decoding states may be evaluated.

Figure 6:
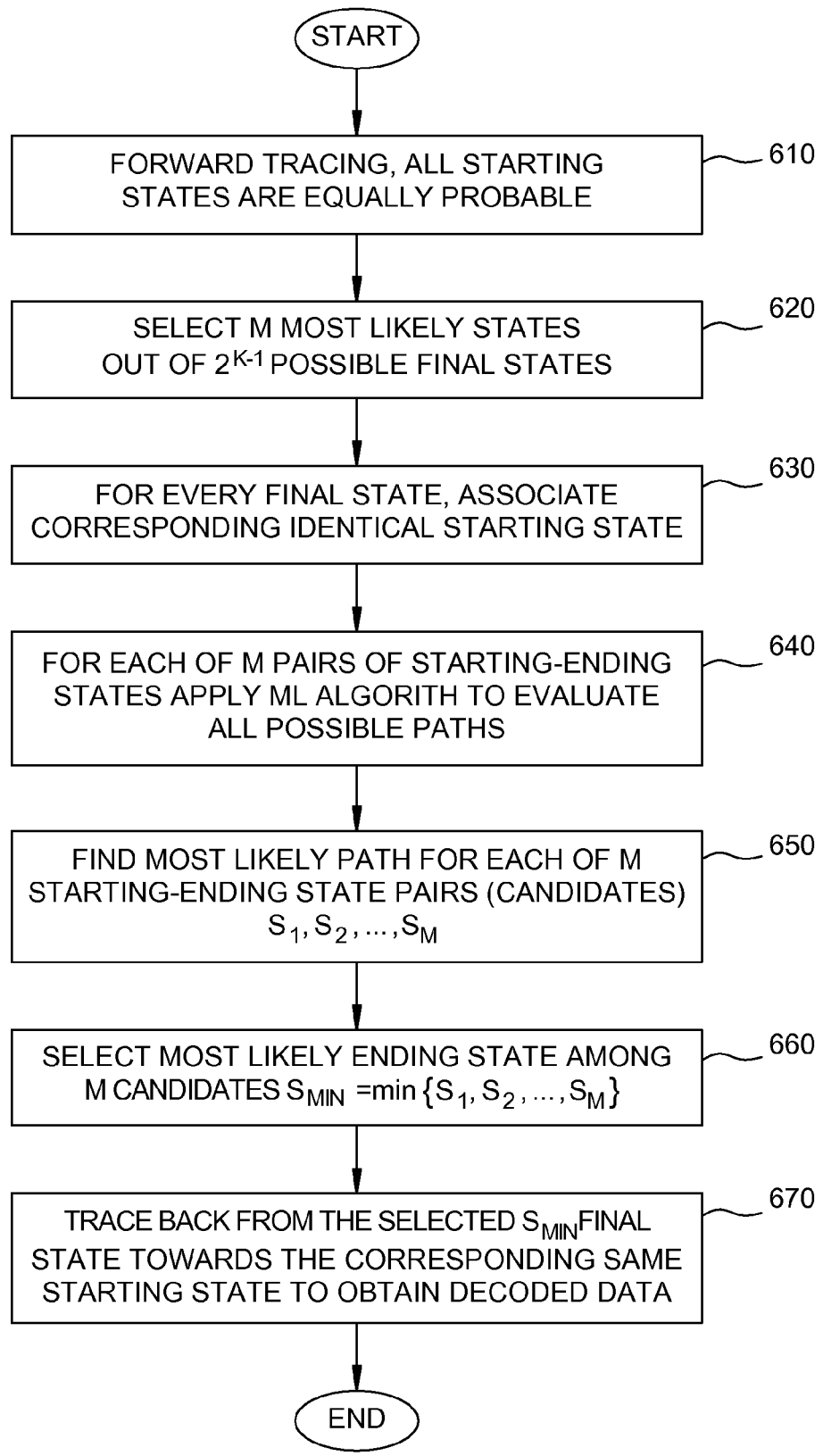
FIG. 6 illustrates example operations for performing a modified maximum-likelihood TBCC decoding.

FIG. 6 illustrates example operations for a decoding process using a modified ML based TBCC decoding algorithm in accordance with certain embodiments of the present disclosure. The example operations may be described with reference to FIGS. 7A-7E, which illustrate a relatively simple decoding example utilizing the M-ML TBCC decoding algorithm presented herein. In the illustrated example, it is assumed that a received packet is composed of a single block. However, the algorithm may, of course, be used for decoding of a plurality of blocks within a single received packet. It is further assumed that the decoder constraint length is K, and the number of possible decoding states is therefore $N_S=2^{K-1}$.

Figure 7A:
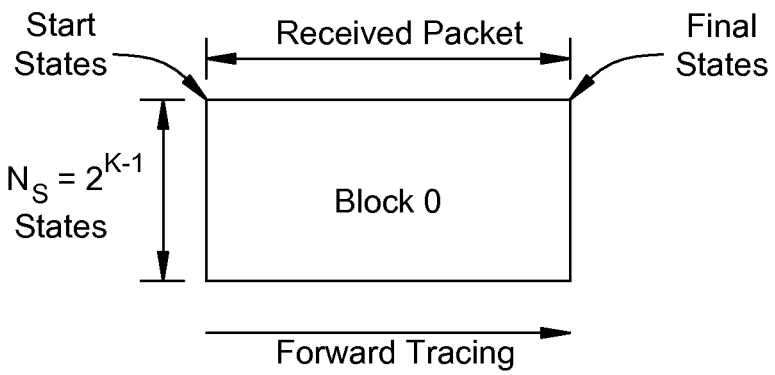
FIGS. 7A-7E illustrate operations of a modified maximum-likelihood TBCC decoding in accordance with certain embodiments of the present disclosure.

The operations 600 begin, at 610, with forward tracing, initially performed with starting states initialized to have equal probability. The forward tracing may be initially performed to construct the trellis, as illustrated in FIG. 7A.

Figure 7B:
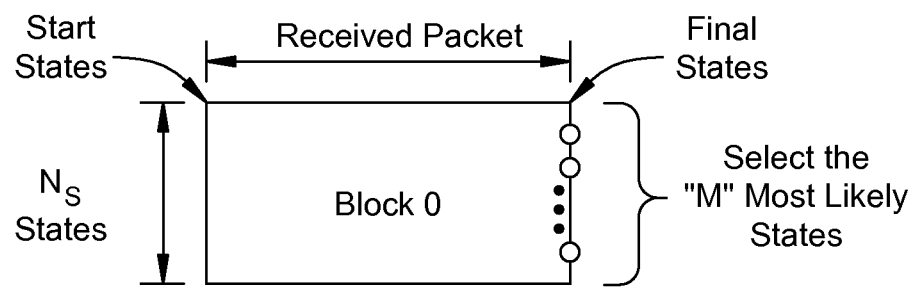
Figure 7C:
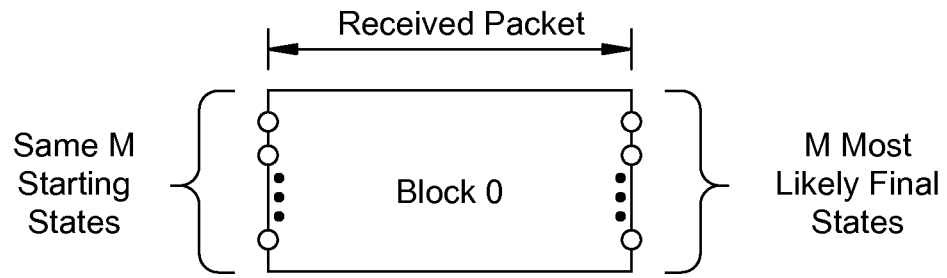

At 620, the M most likely final decoding states out of $N_S=2^{K-1}$ possible states may be selected based on path metrics. This selection of most likely final decoding states is illustrated in FIG. 7B. At this point, path metrics at the final stage are used to select candidates. At 630, each selected final decoding state may be associated with the corresponding identical starting state. Final decoding states and their corresponding starting states are illustrated in FIG. 7C.

At 640, a maximum-likelihood (ML) search is then conducted for all M candidate pairs (starting-ending state pairs), in an effort to evaluate all possible paths for these decoding states. At 650, the most likely paths may be determined for each of M candidates.

Figure 7D:
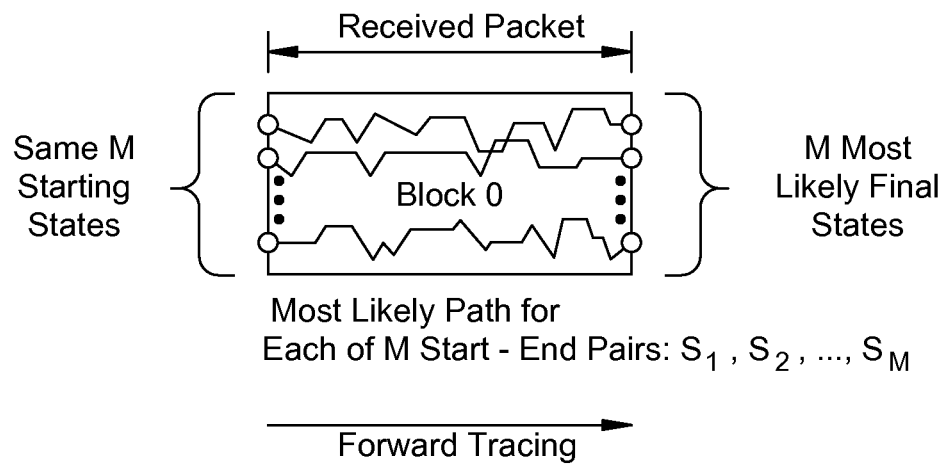

The selected paths can be represented with path metrics $S_1$, $S_2, \ldots, S_M$, as illustrated in FIG. 7D. At 660, the most likely final state among the M candidate states may be selected by finding the minimum overall path metric:

$$S_{min}=\min\{S_1,S_2,\ldots,S_M\} \quad (1)$$

Figure 7E:
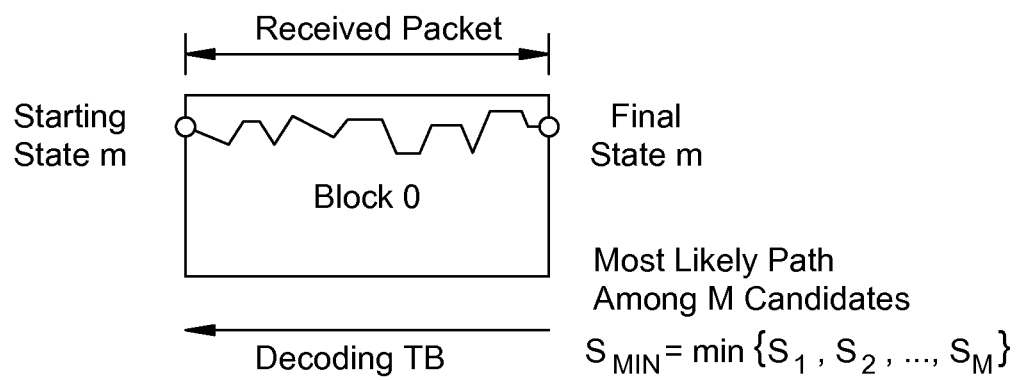

After selecting the most likely final states among the candidate states, the traceback from the selected final decoding state towards the same starting state may be performed to obtain decoded data, at 670. Final traceback decoding is illustrated in FIG. 7E.

The modified ML TBCC decoding scheme presented herein may achieve good packet error performance with relatively low computational complexity. FIG. 8 summarizes example packet error rate performance obtained as simulation results for different TBCC decoding algorithms. The table in FIG. 8 compares the packet error rate (PER) performance of the M-ML TBCC decoding scheme presented herein with ML based TBCC decoding and replicated TBCC decoding. As illustrated, the simulation results may be presented as a signal-to-noise ratio value (in dB units) required to achieve the PER of $10^{-3}$.

Different numbers of candidates and different numbers of replicated blocks may be utilized for M-ML TBCC decoding and replicated TBCC decoding, respectively. In these example simulations results illustrated in FIG. 8, the replicated TBCC decoding algorithm has been evaluated for 3, 5, 11, and 47 replicated blocks (simulation setups REP3, REP5, REP11 and REP47 in FIG. 8, respectively) where the traceback decoding is performed from the most likely final state obtained after the construction of trellis. The M-ML TBCC decoding is evaluated for M=12, 24 and 36 decoding candidate states (simulation setups labeled in FIG. 8 as MoML12, MoML24 and MoML32, respectively) out of $2^6=64$ possible decoding states (constraint length of K=7 is assumed).

For these exemplary simulations, a single coding block may be utilized to select the M most likely states, where one coding block may consist of three information bytes. Simulation measurements presented in FIG. 8 were performed for a total of 100,000 modulated constellation symbols, BPSK modulation is applied at the transmitter, the code rate is ½, perfect channel state information is available at the receiver, and the packet error rate performance are evaluated for two different channel environments—Additive White Gaussian Noise (AWGN) channels, and Rayleigh fading channels.

As illustrated in FIG. 8, a modified ML TBCC decoding with 24 candidate states (M=24) may achieve a comparable or identical packet error rate performance as an ML based TBCC decoding in both AWGN and Rayleigh fading channels. For this particular number of evaluated decoding states and for the constraint length of K=7, a reduction in computational complexity of about 62.5% can be achieved. In general, a reduction of computational complexity for an M-ML TBCC decoding technique compare to an ML based TBCC decoding (in percentage units) may be determined as:

$$\left(1-\frac{M}{2^{K-1}}\right)\cdot 100\% \quad (2)$$

It can be observed that the reduction in computational complexity is larger if a smaller number of candidate decoding states M are evaluated for a larger constraint length K. On the other side, a larger error rate performance loss may be introduced. Therefore, the number of evaluated states M in a modified ML TBCC decoding may be determined as a tradeoff value between a desired reduction of the computational complexity and allowable error rate performance loss compare to the optimal ML based TBCC decoding.

Figure 6A:
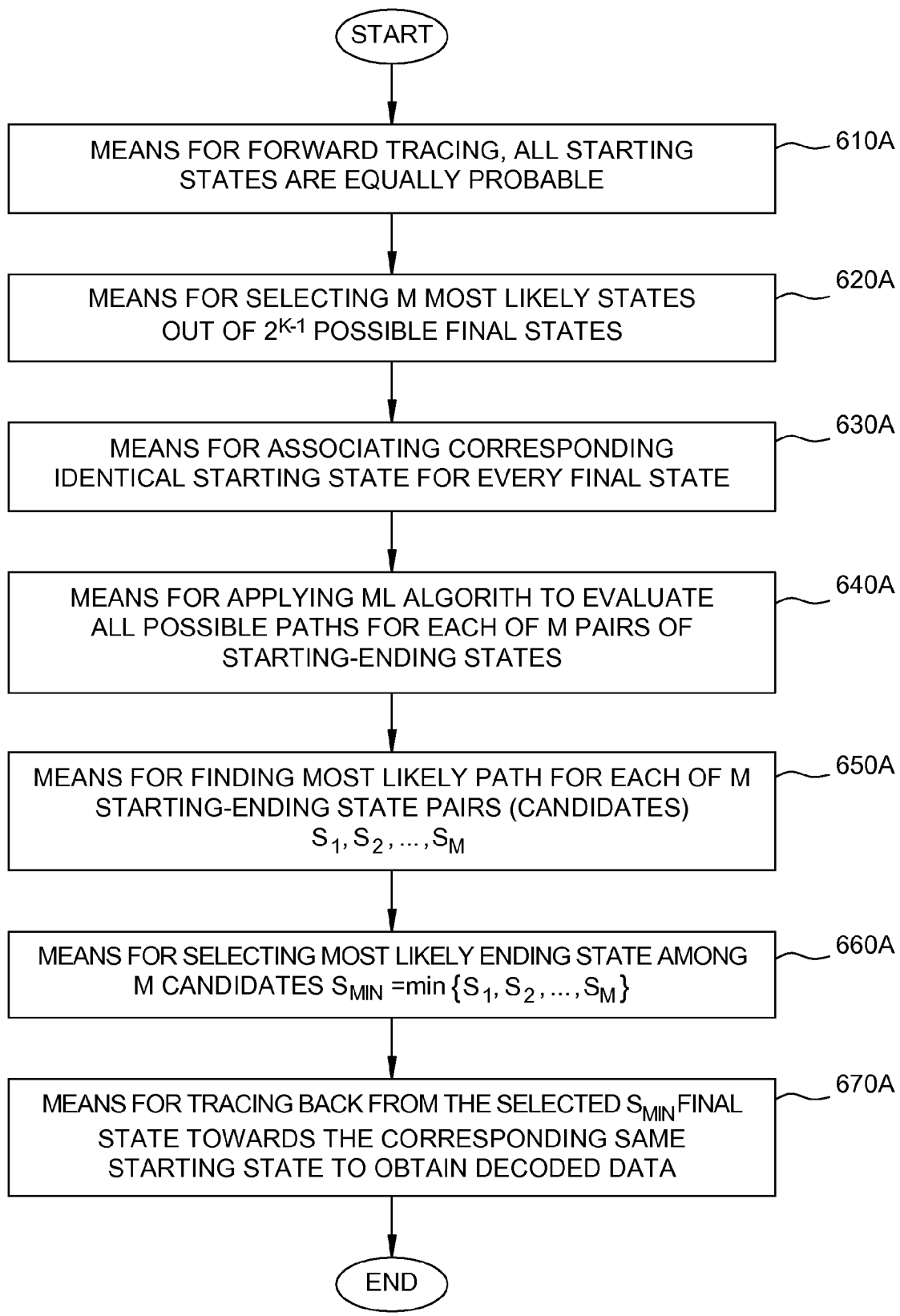
FIG. 6A illustrates example components capable of performing the operations of FIG. 6.

The various operations of methods described above may be performed by various hardware and/or software component(s) and/or module(s) corresponding to means-plus-function blocks illustrated in the Figures. For example, blocks 610-670 illustrated in FIG. 6 correspond to means-plus-function blocks 610A-670A illustrated in FIG. 6A. More generally, where there are methods illustrated in Figures having corresponding counterpart means-plus-function Figures, the operation blocks correspond to means-plus-function blocks with similar numbering.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

Information and signals may be represented using any of a variety of different technologies and techniques. For example, data, instructions, commands, information, signals and the like that may be referenced throughout the above description may be represented by voltages, currents, electromagnetic waves, magnetic fields or particles, optical fields or particles or any combination thereof.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein, such as those illustrated in the Figures, can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims While the foregoing is directed to embodiments of the present invention, other and further embodiments of the invention may be devised without departing from the basic scope thereof, and the scope thereof is determined by the claims that follow.

What is claimed is:

1. A method for performing a tail biting convolution code (TBCC) decoding scheme, comprising:
    receiving a packet of one or more blocks of encoded data bits, each block being encoded with a redundancy such that a final decoding state of each block is identical to a starting decoding state of that block;
    replicating a predetermined number of one or more blocks of the received packet prior to initializing a probability of each starting decoding state;
    appending at least one replicated block to the received packet;
    initializing a probability of each starting decoding state to equal probabilities;
    forward tracing from each starting decoding state to each identical final decoding state for each block in the appended packet prior to selecting M most likely final states;
    constructing a trellis over the length of the appended packet based on the forward tracing;
    selecting, by a processor, the M most likely final states from a set of more than M possible final decoding states for each block in the appended packet, each selected final decoding state having an associated identical starting decoding state;
    applying, by the processor, a maximum liklihood (ML) algorithm to select a most likely path from a set of paths between pairs of the selected final decoding states and the associated starting decoding states for each block in the appended packet, the selected most likely path comprising a minimum value among values for each path of the set of paths; and
    obtaining, by a decoder, decoded data bits by tracing back from the selected most likely path for each block in the appended packet.

2. The method of claim 1, wherein selecting M most likely final states from a set of more than M possible final decoding states comprises selecting M most likely final states from all possible final states as determined by a constraint length.

3. The method of claim 1, wherein M is greater than or equal to 12.

4. An apparatus for performing a tail biting convolution code (TBCC) decoding scheme, comprising:
    a processor;
    a memory in electronic communication with the processor, the memory storing executable instructions that when executed by the processor cause the processor to perform the operations comprising:

receiving a packet of one or more blocks of encoded data bits, each block being encoded with a redundancy such that a final decoding state of each block is identical to a starting decoding state of that block;

replicating a predetermined number of one or more blocks of the received packet prior to initializing a probability of each starting decoding state;

appending at least one replicated block to the received packet;

initializing a probability of each starting decoding state to equal probabilities;

forward tracing from each starting decoding state to each identical final decoding state for each block in the appended packet prior to selecting M most likely final states;

constructing a trellis over the length of the appended packet based on the forward tracing;

selecting, by a processor, the M most likely final states from a set of more than M possible final decoding states for each block in the appended packet, each selected final decoding state having an associated identical starting decoding state;

applying, by the processor, a maximum liklihood (ML) algorithm to select a most likely path from a set of paths between pairs of the selected final decoding states and the associated starting decoding states for each block in the appended packet, the selected most likely path comprising a minimum value among values for each path of the set of paths; and obtaining, by a decoder, decoded data bits by tracing back from the selected most likely path for each block in the appended packet.

5. The apparatus of claim 4, wherein the instructions for selecting M most likely final states from a set of more than M possible final decoding states further cause the processor to select M most likely final states from all possible final states as determined by a constraint length.

6. The apparatus of claim 4, wherein M is greater than or equal to 12.

7. An apparatus for performing a tail biting convolution code (TBCC) decoding scheme, comprising:

means for receiving a packet of one or more blocks of encoded data bits, each block being encoded with a redundancy such that a final decoding state of each block is identical to a starting decoding state of that block;

means for replicating a predetermined number of one or more blocks of the received packet prior to initializing a probability of each starting decoding state;

means for appending at least one replicated block to the received packet;

means for initializing a probability of each starting decoding state to equal probabilities;

means for forward tracing from each starting decoding state to each identical final decoding state for each block in the appended packet prior to selecting M most likely final states;

means for constructing a trellis over the length of the appended packet based on the forward tracing;

means for selecting, by a processor, the M most likely final states from a set of more than M possible final decoding states for each block in the appended packet, each selected final decoding state having an associated identical starting decoding state;

means for applying, by the processor, a maximum liklihood (ML) algorithm to select a most likely path from a set of paths between pairs of the selected final decoding states and the associated starting decoding states for each block in the appended packet, the selected most likely path comprising a minimum value among values for each path of the set of paths; and means for obtaining, by a decoder, decoded data bits by tracing back from the selected most likely path for each block in the appended packet.

8. The apparatus of claim 7, wherein the means for selecting M most likely final states from a set of more than M possible final decoding states is configured to select M most likely final states from all possible final states as determined by a constraint length.

9. The apparatus of claim 7, wherein M is greater than or equal to 12.

10. A computer-program product for performing a tail biting convolution code (TBCC) decoding scheme, comprising a non-transitory computer readable storage medium storing instructions that when executed by one or more processors cause the one or processors to perform the operations comprising:

receiving a packet of one or more blocks of encoded data bits, each block being encoded with a redundancy such that a final decoding state of each block is identical to a starting decoding state of that block;

replicating a predetermined number of one or more blocks of the received packet prior to initializing a probability of each starting decoding state;

appending at least one replicated block to the received packet;

initializing a probability of each starting decoding state to equal probabilities;

forward tracing from each starting decoding state to each identical final decoding state for each block in the appended packet prior to selecting M most likely final states;

constructing a trellis over the length of the appended packet based on the forward tracing;

selecting, by a processor, the M most likely final states from a set of more than M possible final decoding states for each block in the appended packet, each selected final decoding state having an associated identical starting decoding state;

applying, by the processor, a maximum liklihood (ML) algorithm to select a most likely path from a set of paths between pairs of the selected final decoding states and the associated starting decoding states for each block in the appended packet, the selected most likely path comprising a minimum value among values for each path of the set of paths; and obtaining, by a decoder, decoded data bits by tracing back from the selected most likely path for each block in the appended packet.

11. The computer-program product of claim 10, wherein the instructions for selecting M most likely final states from a set of more than M possible final decoding states are further executable to cause the one or more processors to perform the operations comprising selecting M most likely final states from all possible final states as determined by a constraint length.

12. The computer-program product of claim 10, wherein M is greater than or equal to 12.

* * * * *